United States Patent
Mungekar et al.

(10) Patent No.: US 10,636,630 B2
(45) Date of Patent: Apr. 28, 2020

(54) PROCESSING CHAMBER AND METHOD WITH THERMAL CONTROL

(71) Applicant: Applied Materials, Inc., Santa Clara, CA (US)

(72) Inventors: Hemant P. Mungekar, Campbell, CA (US); Ganesh Balasubramanian, Fremont, CA (US); Yoichi Suzuki, Funabashi (JP); Abdul Aziz Khaja, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/033,707

(22) Filed: Jul. 12, 2018

(65) Prior Publication Data

US 2019/0066984 A1 Feb. 28, 2019

Related U.S. Application Data (60) Provisional application No. 62/562,863, filed on Sep. 25, 2017, provisional application No. 62/537,893, filed on Jul. 27, 2017.

(51) Int. Cl.
*H01J 37/32* (2006.01)
*H05B 1/02* (2006.01)
(Continued)

(52) U.S. Cl.
CPC ...... *H01J 37/32724* (2013.01); *H01L 21/324* (2013.01); *H01L 21/67103* (2013.01);
(Continued)

(58) Field of Classification Search
None
See application file for complete search history.

(56) References Cited

U.S. PATENT DOCUMENTS 4,092,520 A * 5/1978 Holmes ............ G05D 23/2401
219/504
5,260,668 A 11/1993 Mallory et al.
(Continued)

FOREIGN PATENT DOCUMENTS

JP H10116885 A 6/1998
KR 101681493 B1 5/2016

OTHER PUBLICATIONS

Liu, Jun et al; High-Temperature Dielectric Properties of Aluminum Nitride Ceramic for Wireless Passive Sensing Applications; Sensors 2015, 15, 22600-22671.

(Continued)

*Primary Examiner* — David E Graybill
(74) *Attorney, Agent, or Firm* — Patterson + Sheridan LLP (57) ABSTRACT

A processing chamber and a processing method for processing a substrate in the processing chamber with thermal control are described herein. The method includes heating a first substrate using a heater apparatus during a first processing operation. The heater apparatus has a first setpoint during at least a first portion of the first processing operation. The first substrate is disposed on a substrate support surface of an electrostatic chuck in a processing chamber. The method further includes determining a first parameter change corresponding to a resistivity change in the electrostatic chuck, determining a second setpoint for the heater apparatus based on the first parameter change, and controlling the heater apparatus to the second setpoint.

15 Claims, 6 Drawing Sheets

(51) Int. Cl.
  *H01L 21/67* (2006.01)
  *H01L 21/683* (2006.01)
  *H01L 21/66* (2006.01)
  *H01L 21/324* (2006.01)

(52) U.S. Cl.
  CPC .... *H01L 21/67248* (2013.01); *H01L 21/6831* (2013.01); *H01L 21/6833* (2013.01); *H01L 22/26* (2013.01); *H05B 1/0233* (2013.01); H01J 2237/2001 (2013.01); H01J 2237/24585 (2013.01); H01J 2237/332 (2013.01); H01J 2237/334 (2013.01)

(56) References Cited

U.S. PATENT DOCUMENTS

| | | | | |
|---|---|---|---|---|
| 5,463,526 | A | * | 10/1995 | Mundt .................. C23C 28/00 361/230 |
| 5,737,178 | A | | 4/1998 | Herchen |
| 5,886,865 | A | | 3/1999 | Parkhe et al. |
| 5,933,314 | A | * | 8/1999 | Lambson ............ H01L 21/6833 279/128 |
| 6,005,376 | A | * | 12/1999 | Mett ........................ G05F 1/46 323/275 |
| 6,095,084 | A | | 8/2000 | Shamouilian et al. |
| 6,198,616 | B1 | | 3/2001 | Dahimene et al. |
| 6,207,938 | B1 | * | 3/2001 | Taylor .................. H05B 1/0294 219/504 |
| 6,293,698 | B1 | | 9/2001 | Alvis |
| 6,302,966 | B1 | | 10/2001 | Bailey, III et al. |
| 6,304,424 | B1 | | 10/2001 | Mett et al. |
| 6,342,691 | B1 | | 1/2002 | Johnsgard et al. |
| 6,721,162 | B2 | | 4/2004 | Weldon et al. |
| 6,853,533 | B2 | | 2/2005 | Parkhe |
| 6,853,953 | B2 | * | 2/2005 | Brcka ................. H01L 21/6831 700/108 |
| 6,890,403 | B2 | | 5/2005 | Cheung et al. |
| 6,919,540 | B2 | * | 7/2005 | Kaastra .................... H05B 3/26 219/441 |
| 7,342,329 | B2 | * | 3/2008 | Kaastra ................ H05B 1/0266 219/447.1 |
| 7,567,422 | B2 | * | 7/2009 | Kitsunai ............. H01L 21/6833 361/230 |
| 7,813,103 | B2 | | 10/2010 | Shannon et al. |
| 8,501,631 | B2 | * | 8/2013 | Valcore, Jr. ....... H01J 37/32082 438/729 |
| 9,128,473 | B2 | * | 9/2015 | Valcore ............. H01J 37/32082 |
| 9,455,126 | B2 | * | 9/2016 | Valcore, Jr. ....... H01J 37/32082 |
| 9,911,577 | B2 | * | 3/2018 | Valcore, Jr. ....... H01J 37/32082 |
| 10,237,916 | B2 | * | 3/2019 | Voronin ............... H05B 1/0233 |
| 2002/0135969 | A1 | | 9/2002 | Weldon et al. |
| 2003/0033116 | A1 | * | 2/2003 | Brcka ................. H01L 21/6831 702/182 |
| 2005/0000442 | A1 | | 1/2005 | Hayashi et al. |
| 2007/0035908 | A1 | * | 2/2007 | Kitsunai ............. H01L 21/6833 361/234 |
| 2007/0091541 | A1 | | 4/2007 | Buchberger et al. |
| 2007/0146961 | A1 | * | 6/2007 | Morioka ............ H01L 21/6831 361/234 |
| 2008/0186647 | A1 | * | 8/2008 | Kawajiri ................ H02N 13/00 361/234 |
| 2009/0236315 | A1 | * | 9/2009 | Willwerth ......... H01J 37/32522 216/67 |
| 2011/0118863 | A1 | * | 5/2011 | Valcore, Jr. ............. G01N 27/62 700/108 |
| 2011/0137446 | A1 | * | 6/2011 | Valcore, Jr. ....... H01J 37/32082 700/108 |
| 2011/0199093 | A1 | * | 8/2011 | Fujisawa .............. B23Q 17/002 324/537 |
| 2013/0265690 | A1 | * | 10/2013 | Maeta ............... H01L 21/67248 361/234 |
| 2013/0270252 | A1 | | 10/2013 | Ambal et al. |
| 2013/0345847 | A1 | * | 12/2013 | Valcore, Jr. ....... H01J 37/32082 700/108 |
| 2015/0332894 | A1 | * | 11/2015 | Valcore, Jr. ....... H01J 37/32082 700/121 |
| 2016/0300741 | A1 | | 10/2016 | Singh et al. |
| 2016/0351375 | A1 | * | 12/2016 | Valcore, Jr. ....... H01J 37/32082 |
| 2016/0370796 | A1 | * | 12/2016 | Musselman ....... G05B 19/41875 |
| 2017/0094719 | A1 | * | 3/2017 | Voronin ............... H05B 1/0233 |
| 2017/0099699 | A1 | * | 4/2017 | Nosrati ................. H05B 3/0014 |
| 2017/0256431 | A1 | * | 9/2017 | Parkhe ............. H01L 21/67109 |
| 2017/0011974 | A1 | | 12/2017 | Yokawa et al. |
| 2018/0269089 | A1 | * | 9/2018 | Merchant ............. G01J 5/0003 |
| 2019/0066984 | A1 | * | 2/2019 | Mungekar ........... H01L 21/6831 |

OTHER PUBLICATIONS

International Search Report and Written Opinion for Application No. PCT/US2018/044037 dated Nov. 9, 2018.

* cited by examiner

FIG. 9

PROCESSING CHAMBER AND METHOD WITH THERMAL CONTROL

CROSS-REFERENCE TO RELATED APPLICATIONS

This application claims benefit of U.S. provisional patent application Ser. No. 62/537,893, filed Jul. 27, 2017 and U.S. provisional patent application Ser. No. 62/562,863 filed Sep. 25, 2017, both of which are herein incorporated by reference.

BACKGROUND

Field

Implementations of the present disclosure generally relate to apparatuses for processing substrates, such as semiconductor substrates. More particularly, to temperature control of processing chambers for semiconductor substrates.

Description of the Related Art

In the processing of substrates in a processing chamber, a substrate is placed on a substrate support in a processing chamber while suitable process conditions are maintained in the processing chamber to deposit, etch, form layers on, or otherwise treat surfaces of the substrate. The substrate may be processed in a processing chamber using a high temperature plasma processing environment. One process condition that is important for key properties of the substrate during processing is a substrate temperature. The substrate temperature is the temperature of the substrate being processed in the processing chamber. The substrate temperature needs to be maintained at a target substrate temperature to achieve high tolerances for the substrate being fabricated.

As feature sizes for substrates are reduced and temperatures in the processing chambers increase, there is an increased need to maintain the substrate temperature of the substrate being processed at the target substrate temperature. The processing of the substrates is highly sensitive to temperature fluctuations during processing and controlling the substrate temperature of the substrate is necessary to achieve high tolerances for the substrates being processed.

The substrate support in the processing chamber may include a heater apparatus for heating the processing volume of the processing chamber and the substrate supported by the substrate support. The heater apparatus has a heater temperature setpoint that determines the heat output of the heater apparatus. The heater apparatus is controlled to have a selected heater temperature setpoint to maintain the substrate temperature at a target substrate temperature.

There is a need for methods and apparatus for controlling the substrate temperature during processing.

SUMMARY

In one implementation, a method includes heating a first substrate using a heater apparatus during a first processing operation. The heater apparatus has a first setpoint during at least a first portion of the first processing operation. The first substrate is disposed on a substrate support surface of an electrostatic chuck in a processing chamber. The method further includes determining a first parameter change corresponding to a resistivity change in the electrostatic chuck, determining a second setpoint for the heater apparatus based on the first parameter change, and controlling the heater apparatus to the second setpoint.

In another implementation, a method includes performing a plurality of first processing runs to process a plurality of first substrates. At least one of the plurality of first substrates is processed during each of the first processing runs. The method further includes controlling a heater apparatus to have a first setpoint during the plurality of first processing runs, and determining a first parameter change. The first parameter change corresponds to a plurality of first resistivity changes in an electrostatic chuck disposed in the processing chamber during the plurality of first processing runs. The method further includes determining a second setpoint for the heater apparatus based on the first parameter change, performing a plurality of second processing runs to process a plurality of second substrates, and controlling the heater apparatus to the second setpoint during the plurality of second processing runs.

In another implementation, a non-transitory machine readable storage medium having stored thereon a computer program for processing a substrate in a processing chamber. The computer program includes a set of instructions for causing the processing chamber to perform a process including heating a first substrate using a heater apparatus during a first processing operation. The heater apparatus has a first setpoint during at least a first portion of the first processing operation, and the first substrate is disposed on a substrate support surface of an electrostatic chuck in a processing chamber. The method further including determining a first parameter change corresponding to a resistivity change in the electrostatic chuck, determining a second setpoint for the heater apparatus based on the first parameter change, and controlling the heater apparatus to the second setpoint.

BRIEF DESCRIPTION OF THE DRAWINGS

So that the manner in which the above recited features of the present disclosure can be understood in detail, a more particular description of the disclosure, briefly summarized above, may be had by reference to aspects of the disclosure, some of which are illustrated in the appended drawings. It is to be noted, however, that the appended drawings illustrate only typical aspects of this disclosure and are therefore not to be considered limiting of its scope, for the disclosure may admit to other equally effective aspects.

To facilitate understanding, identical reference numerals have been used, wherever possible, to designate identical elements that are common to the Figures. Additionally, elements of one example may be advantageously adapted for utilization in other examples described herein.

DETAILED DESCRIPTION

This disclosure generally relates to a method and apparatus for detecting and/or controlling a temperature of a substrate being processed in a processing chamber. The method and apparatus provides thermal control of the substrate in a processing volume of the processing chamber. In one implementation, an electrostatic chuck (ESC) having a dielectric material and electrode is used as a substrate temperature sensor. A chucking voltage is applied to the electrode to create a chucking force on the substrate. During processing of the substrate in the processing chamber, a leakage current flows through the dielectric and electrode of the electrostatic chuck and is measured by a leakage current sensor. Changes in the leakage current correspond to changes in the substrate temperature. A heater temperature setpoint is adjusted by a system controller that uses leakage current parameters from the substrate temperature sensor. The system controller adjusts the heater temperature setpoint based at least in part on the leakage current information from the leakage current sensor. The system controller adjusts the heater temperature setpoint to maintain the substrate temperature at a target substrate temperature during at least a portion of a processing operation in the processing chamber.

Figure 1:
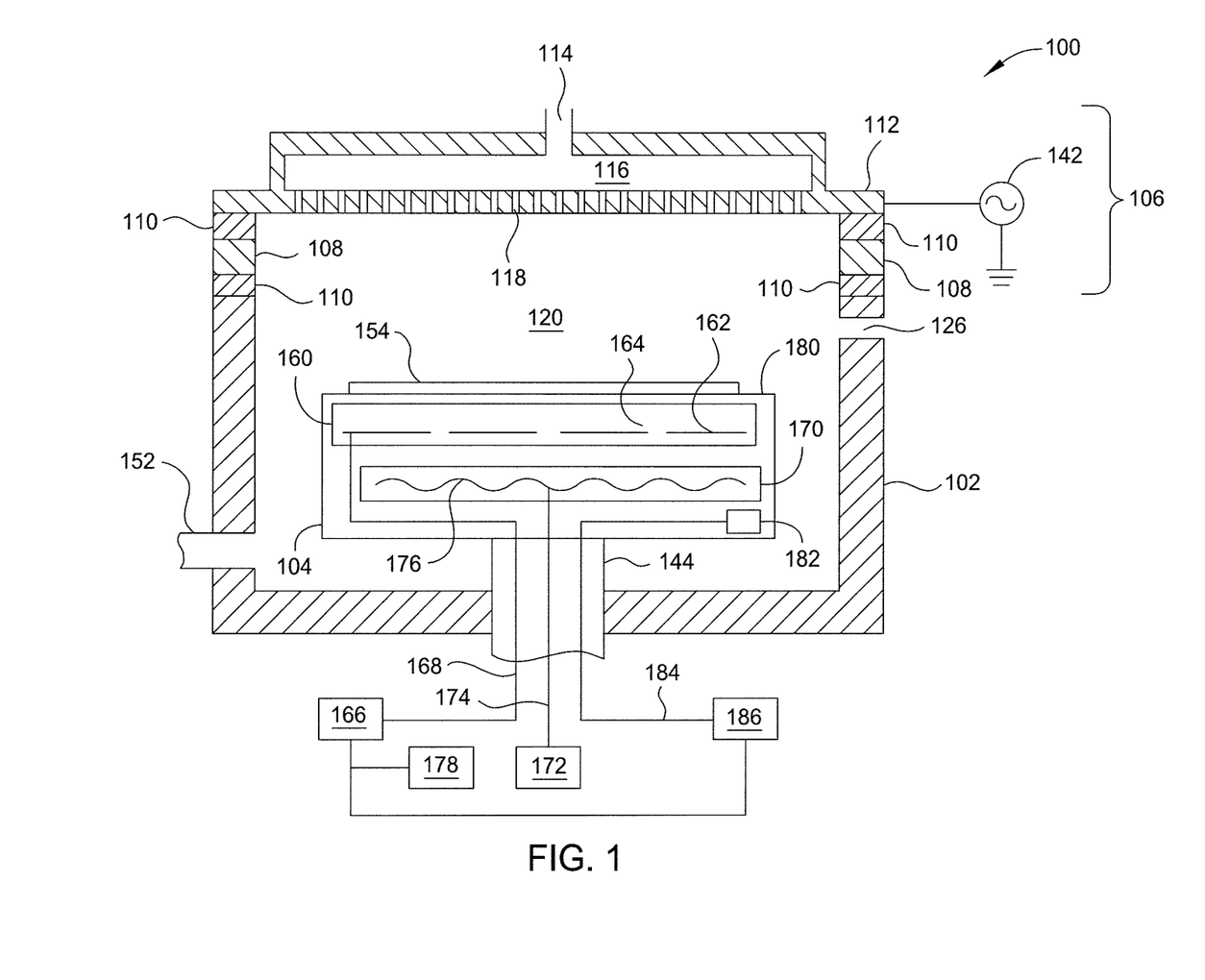
FIG. 1 is a schematic cross-sectional view of a processing chamber that can be used for one implementation.

FIG. 1 is a cross-sectional view of a processing chamber 100, according to one aspect of the disclosure. The processing chamber 100 may be an etch chamber suitable for etching a substrate, such as a substrate 154. Examples of processing chambers that may be adapted to benefit as described herein are PRODUCER® Etch Processing Chamber, and PRECISION™ Processing Chamber, commercially available from Applied Materials, Inc., located in Santa Clara, Calif. Other processing chambers, including those from other manufacturers, may also be used.

The processing chamber 100 may be used for various plasma processes, including deposition and removal processes. In one aspect, the processing chamber 100 may be used to perform dry etching with one or more etching agents. For example, the processing chamber 100 may be used to form a plasma from a precursor $C_xF_y$ (where x and y represent known compounds), $O_2$, $NF_3$, or combinations thereof. In another implementation, the processing chamber 100 may be used for plasma enhanced chemical vapor deposition (PECVD) with one or more chemical agents.

The processing chamber 100 includes a chamber body 102, a lid assembly 106, and a substrate support assembly 104. The lid assembly 106 is positioned at an upper end of the chamber body 102. The lid assembly 106 and substrate support assembly 104 of FIG. 1 may be used with any processing chamber for plasma or thermal processing. Chambers from other manufacturers may also be used with the components described above. The substrate support assembly 104 is disposed inside the chamber body 102, and a lid assembly 106 is coupled to the chamber body 102 and encloses the substrate support assembly 104 in a processing volume 120. The chamber body 102 includes a slit valve opening 126 formed in a sidewall thereof. The slit valve opening 126 is selectively opened and closed to allow access to the processing volume 120 by a substrate handling robot (not shown) for substrate transfer. An exhaust port 152 is shown extending through the chamber body 102.

A top electrode 108 may be disposed adjacent to the chamber body 102 and separating the chamber body 102 from other components of the lid assembly 106. The top electrode 108 may be part of the lid assembly 106, or may be a separate side wall electrode.

An isolator 110, which may be a dielectric material such as a ceramic or metal oxide, for example aluminum oxide and/or aluminum nitride, contacts the top electrode 108 and separates the top electrode 108 electrically and thermally from a gas distributor 112 and from the chamber body 102. The gas distributor 112 has openings 118 for admitting process gases into the processing volume 120. The process gases may be supplied to the processing chamber 100 via a conduit 114, and the process gases may enter a gas mixing region 116 prior to flowing through the openings 118. The gas distributor 112 may be coupled to a source of electric power 142, such as an RF generator. DC power, pulsed DC power, and pulsed RF power may also be used.

The substrate support assembly 104 may include a substrate support surface 180 disposed at an upper end thereof. The substrate support assembly 104 may be formed from a metallic or ceramic material, for example a metal oxide or nitride or oxide/nitride mixture such as aluminum, aluminum oxide, aluminum nitride, or an aluminum oxide/nitride mixture. The substrate support surface 180 is configured to support the substrate 154 for processing. The substrate support surface 180 may be coupled to a lift mechanism through a shaft 144, which extends through a bottom surface of the chamber body 102. The lift mechanism may be flexibly sealed to the chamber body 102 by a bellows that prevents vacuum leakage from around the shaft 144. The lift mechanism allows the substrate support surface 180 to be moved vertically within the chamber body 102 between a lower transfer position and a number of raised process positions.

An electrostatic chuck (ESC) 160 is disposed in the substrate support assembly 104. The electrostatic chuck 160 includes one or more electrodes 162 and a dielectric material 164. In some implementations, the dielectric material 164 of the electrostatic chuck 160 forms the substrate support surface 180. Four electrodes 162 are depicted by dashed lines in FIG. 1. The dielectric material 164 may be any dielectric material suitable for use with electrostatic chucks. In implementations of the electrostatic chuck 160, the dielectric material may comprise an oxide/nitride mixture such as aluminum, aluminum oxide, aluminum nitride, or an aluminum oxide/nitride mixture.

The electrodes 162 may be embedded in the dielectric material 164. The electrodes 162 may be embedded within the substrate support assembly 104 or coupled to a surface of the substrate support assembly 104. The one or more electrodes 162 may be a plate, a perforated plate, a mesh, a wire screen, or any other distributed arrangement. The one or more electrodes 162 may be coupled to an electrode power supply 166 through an electrode control line 168 to provide power to the electrodes 162 and facilitate chucking of the substrate 154 during processing of the substrate 154. The electrode power supply 166 is depicted by in FIG. 2 as $V_{ESC}$ and includes a ground 216.

Powering the electrodes 162 with electrode power supply 166 generates an electric field to attract the substrate 154 towards the electrodes 162 and the substrate support surface 180 so as to secure the substrate 154 to the substrate support surface 180 of the substrate support assembly 104. The electrode control line 168 may be a cable. The electrode power supply 166 may apply a DC voltage to the electrodes 162. A leakage current sensor 178 is coupled to the electrodes 162, via the electrode power supply 166, to measure leakage current that flows between the substrate 154 and the electrodes 162. In some implementations, the leakage current sensor 178 may be directly coupled to the electrode control line 168.

In some implementations, the substrate support assembly 104 may include additional electrodes 162 for use in combination with top electrode 108 to generate plasma during the processing of the substrate 154. The use of the top electrode 108 and additional electrodes 162 disposed either in the substrate support assembly 104 or proximate the substrate support assembly 104 to generate plasma may have a variety of implementations. In addition, one or more of the electrodes 162 may be used in combination with the top electrode 108 to generate plasma during the processing of the substrate 154.

In some implementations, the electrode power supply 166 provides up to about 1000 W (but not limited to about 1000 W) of RF energy at a frequency of, for example, approximately 13.56 MHz, although other frequencies and powers may be provided depending on the application. The electrode power supply 166 may be capable of producing either or both of continuous or pulsed power. In some aspects, the bias source may be a DC or pulsed DC source. In some aspects, the bias source may be capable of providing multiple frequencies, such as 13.56 MHz and 2 MHz.

The substrate support assembly 104 further includes a heater apparatus 170 disposed therein. The heater apparatus 170 is used to heat the substrate 154, and may incidentally heat the processing volume 120 of the processing chamber 100 during the processing of the substrate 154. The heater apparatus 170 is coupled to a heater power supply 172 through a heater control line 174. The heater apparatus 170 may include a heater element 176 that outputs heat. The heater element 176 may take the form of a heater coil that outputs heat by flowing current therethrough. The heater apparatus 170 may have a variety of implementations. Conduits (not shown) in the substrate support assembly 104 may provide pathways between the heater apparatus and the substrate support surface 180 and the processing volume 120 to facilitate application of heat to the substrate 154. In some implementations, the heater apparatus 170 may be disposed external to the substrate support assembly 104 and proximate to the processing volume 120 to heat the substrate 154 during a processing operation for processing the substrate 154. The heater apparatus 170 may be disposed in the lid assembly 106.

A heater temperature sensor 182 is used to determine the temperature of the heater apparatus 170. The heater temperature sensor 182 may use a thermocouple in determining the heater apparatus temperature. The heater temperature sensor 182 may be in the form of other sensors used to measure temperature of the heater apparatus 170, including a thermistor and lattice vibration sensor. The heater temperature sensor 182 is coupled by a sensor control line 184 to a system controller 186. The system controller 186 is coupled to the heater power supply 172 to control the temperature of the heater apparatus 170. The system controller 186 may adjust parameters of the heater apparatus 170 to adjust and control the temperature of the heater apparatus 170. The system controller 186 is further coupled to the leakage current sensor 178. The leakage current sensor 178 sends information, including leakage current parameters, corresponding to the leakage current flowing between the substrate and the electrodes 162.

Figure 2:
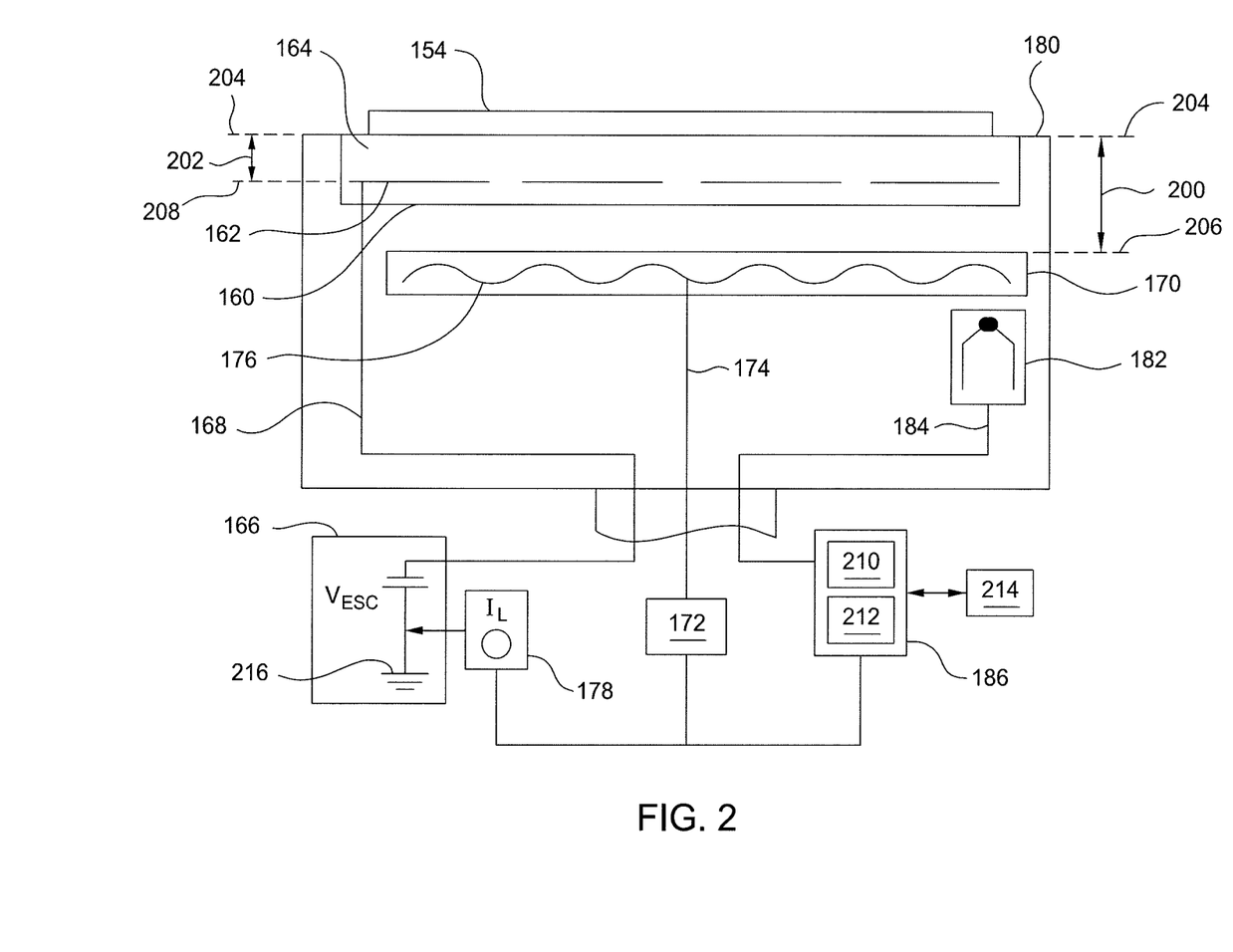
FIG. 2 is an enlarged schematic cross-sectional view of the substrate support assembly of the processing chamber of FIG. 1.

In one example, the system controller 186 may be a general purpose computer that includes a memory 210, as shown in FIG. 2, for storing software. The software may include instructions for controlling the processing chamber 100, including the temperature of the heater apparatus 170 to control the temperature of substrate 154 during processing, as discussed further below.

Referring to FIG. 2, an enlarged schematic cross-sectional view of the substrate support assembly 104 of the processing chamber 100 is shown coupled to the electrode power supply 166, the heater power supply 172, and the system controller 186. The heater apparatus 170 is separated from the substrate support surface 180 and the substrate 154 by a heater distance represented by the arrow 200 disposed between a first horizontal plane 204 defined by the substrate support surface 180 and a second plane 206 extending from the heater apparatus 170.

The electrodes 162 are separated from the substrate support surface 180 and the substrate 154 by an electrode distance represented by the arrow 202 extending between the first horizontal plane 204 and a third horizontal axis 208 extending from the electrodes 162. As shown in FIG. 2, the electrodes 162 of the electrostatic chuck 160 are disposed between the heater apparatus 170 and the substrate support surface 180. In this case, the electrodes 162 are closer to the substrate support surface 180 and the substrate 154 than the heater apparatus 170. For example, in an illustrative implementation, the processing chamber 100 the electrode distance is approximately 1 millimeter and the heater distance is approximately 4 millimeters.

In one implementation, the heater temperature sensor 182 includes a thermocouple positioned proximate to the heater element 176 to measure the heater temperature of heater apparatus 170. The heater temperature may be different from the substrate temperature during the processing of the substrate 154 due at least in part to the distance between the substrate support surface 180 supporting the substrate 154 and the heater apparatus 170. The system controller 186 controls the heater power supply 172 and the heater apparatus 170 so that the heater apparatus 170 is controlled to a heater temperature setpoint to maintain the substrate 154 at a target substrate temperature during a processing operation of the substrate 154.

In some implementations, the processing operation starts when the substrate 154 is loaded into the processing chamber 100 and ends when the substrate 154 is removed from the processing chamber 100. A processing operation that starts when the substrate 154 is loaded into the processing chamber 100 and ends when the substrate 154 is removed from the processing chamber 100 may be referred to as a processing run. In other implementations, the processing operation lasts a specified time period while the substrate 154 is loaded into the processing chamber 100. In some implementations, the target substrate temperature may be 575 degrees Celsius to 700 degrees Celsius. The heater apparatus 170 is controlled by the system controller 186 to maintain the target substrate temperature during the processing operation of the substrate 154.

Maintaining the target substrate temperature during the processing operation of the substrate 154 means that the temperature of substrate is maintained within a tolerance temperature range during the processing operation. For example, the tolerance temperature range may be three degrees Celsius during the processing operation. For example, if the target substrate temperature is 600 degrees Celsius, than the tolerance temperature range for the substrate 154 during the processing operation would be between 599 degrees Celsius and 601 degrees Celsius. For example, the substrate temperature may deviate from a target substrate temperature of 600 degrees Celsius. The substrate temperature is controlled to the target substrate temperature by keeping the substrate temperature within the substrate temperature tolerance range. In other implementations, the tolerance temperature range may be two degrees Celsius for the substrate being processed.

Operational routines, operational information, and operational parameters, including leakage current parameters, and parameter changes, for processing the substrate 154 may be stored in the system controller 186. In addition, heater temperature setpoints and operational parameters corresponding to leakage current parameters may be stored in look-up tables or otherwise to provide information for adjusting the heater apparatus to maintain the substrate temperature at the target substrate temperature according to disclosed implementations.

The system controller 186 may have the memory 210, a CPU 212, and an input/output device 214. The system controller 186 uses the operational routines and operational information to control the operation of the processing chamber 100. A substrate temperature routine is used to maintain the substrate temperature at a target substrate temperature during a processing operation of the substrate 154. The substrate temperature routine may be stored in the memory 210 or on a non-transitory machine readable storage medium. The non-transitory machine readable storage medium having stored thereon a computer program for processing the substrate 154 in the processing chamber 100. The computer program includes a routine of set instructions for causing the processing chamber 100 to perform a process on the substrate 154.

To process the substrate 154, the processing chamber 100 is operated to have a target substrate temperature during a processing operation that may extend over an operation time period. The heater apparatus 170 has a heater temperature setpoint that is established using empirical data for the processing chamber 100 to achieve the target substrate temperature. The empirical data may be for operation of the processing chamber 100 over a maintenance cycle. The maintenance cycle may be for multiple process runs of the processing chamber 100 over multiple days or weeks where multiple substrates 154 are processed.

In some implementations, a first heater temperature setpoint may be used for multiple runs during a first maintenance cycle. At the end of the first maintenance cycle, a maintenance period may occur where maintenance operations are performed on the processing chamber 100. Quality control operations may also be performed during the maintenance period.

The quality control operations may include calibrating the heater temperature setpoints to substrate temperatures measured by substrate temperature sensors that may include infrared temperature sensors and thermocouples. Quality control operations reduce the amount of time the processing chamber 100 is manufacturing substrates 154. In addition, substrates 154 used in the quality control may become contaminated by coming into contact with the temperature sensors. In addition, substrate temperature sensors such as infrared temperature sensors and thermocouples may complicate the design of the processing chamber 100. After quality control operations are completed, the processing chamber 100 may then be put back into production for additional process runs in a subsequent maintenance cycle. By using leakage current as an indicator of temperature, recalibrations and/or complex temperature sensing can be minimized.

During a processing operation, the heater temperature is measured using heater sensor information from the heater temperature sensor 182. The heater sensor information is transmitted to the system controller 186. The system controller 186 may use the heater sensor information to adjust the heater power supply 172 to control the power supplied to the heater apparatus 170. The power from the heater apparatus 170 is adjusted to increase or decrease the heater output so that the heater apparatus 170 has the heater temperature setpoint that has been selected.

The system controller 186 may use empirical data or other information to determine the heater temperature setpoint that corresponds to a target substrate temperature. In some implementations, the system controller 186 may control the heater power supply 172 to provide power to the heater apparatus 170 so that the heater apparatus 170 outputs heat at the heater temperature setpoint that has been selected. For plasma processing operations, the heater temperature setpoint may be in the temperature range of 575 to 700 degrees Celsius. In other substrate processing operations, the heater temperature setpoint range may be 560 to 650 degrees Celsius or the heater temperature setpoint range may be at other temperature ranges.

The target substrate temperature during the processing operation may be inferred based on the heater temperature setpoint using empirical data and other information. However, the substrate temperature may vary during the processing operation of the substrate for a selected heater temperature setpoint. The variation in the substrate temperature for the heater temperature setpoint may be due to a variety of heat inputs and outputs to the substrate 154. For example, radiative boundary conditions of the processing chamber 100 may change due to coatings on the surfaces of components or ageing of components in the processing chamber 100, including components that surround the processing volume 120.

Surfaces of chamber components in the processing chamber 100 may be coated by deposits during processing. The coating may incrementally increase for each additional processing run in a maintenance cycle. Incrementally increasing the coatings in the processing chamber 100 during each processing run may result in a change in the operation of the processing chamber 100. For example, a given heater setpoint may result in different substrate temperature as the coatings become thicker.

The substrate temperature may be impacted by a variety of factors. Plasma power may add a source of heat to provide a heat input to the substrate 154 during the processing operation. In addition, certain components in the processing chamber 100 may operate at different temperatures due to a variety of reasons, including plasma coupling and changes in emissivity. These different conditions may result in variations of the heat input to the substrate 154 and the substrate temperature at a selected heater temperature setpoint during the processing operation.

As discussed below, the heater apparatus 170 may be adjusted from a first heater temperature setpoint used in a first processing run to a second heater temperature setpoint used in a second processing run. The heater temperature setpoints may be adjusted for different processing runs because the operating environment in the processing chamber 100 may be different for each processing run. By adjusting the heater temperature setpoint for different processing runs, the substrate temperature is maintained for the different processing runs despite changing environmental conditions, such as increased coatings on ageing components, for the different processing runs.

The system controller 186 uses the leakage current from the electrostatic chuck 160 to determine the substrate temperature. The leakage current corresponds to the substrate temperature so variations in the leakage current may be used to determine how the substrate temperature may be changing due to the variety of heat inputs and outputs to the substrate. Determining how the substrate temperature is changing at a selected heater temperature setpoint provides information for determining an adjustment to the selected heater temperature setpoint to maintain the substrate temperature at a target substrate temperature. The adjustment to the heater temperature setpoint may be made for one or more subsequent processing runs. In some implementations, a change in substrate temperature is determined in a first processing operation and an adjustment to the heater temperature setpoint from a first heater temperature setpoint to a second heater temperature setpoint to maintain the substrate temperature is made during the first processing operation.

Figure 3:
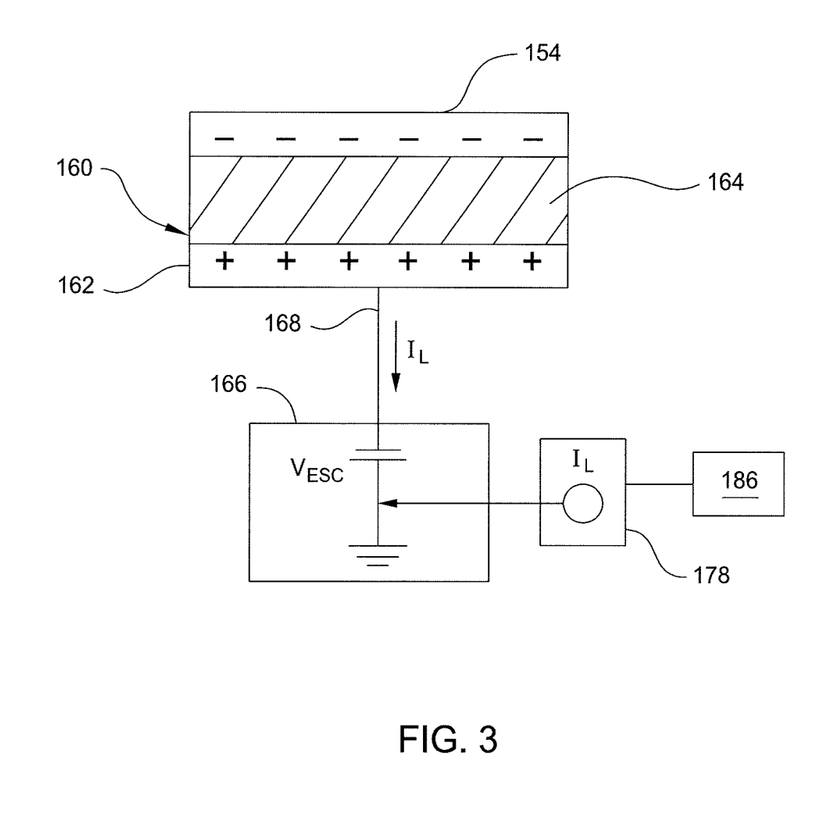
FIG. 3 is a schematic cross-sectional view of an electrostatic chuck of coupled to an electrode power supply, a leakage current sensor, and the system controller, useful for one implementation.

As shown in FIG. 3, the substrate 154 and the electrodes 162 are at different voltages as depicted by the minus symbols on the substrate 154 and the plus symbols on the electrode 162. The substrate 154 and the electrode 162 are separated by the dielectric material 164. The leakage current flows through the dielectric material 164, to the electrode power supply 166 and to the leakage current sensor 178. The leakage current sensor 178 may sense the leakage current or a leakage current parameter corresponding to the leakage current in a conventional manner. The leakage current sensor 178 is conventionally used for measuring leakage current associated with electrostatic chucks. Leakage current information, including leakage current parameters corresponding to the leakage current, is transmitted from the leakage current sensor 178 to the system controller 186.

The leakage current from the electrostatic chuck 160 can be used in determining the substrate temperature because the leakage current changes as a function of temperature. In some implementations, the substrate temperature determined by the leakage current may be the temperature of a top portion of the substrate support surface 180 or a top portion of the dielectric material 164. Because of the close proximity of the substrate support surface 180 and the dielectric material 164 to the substrate 154, the temperature of the top portion of the substrate support surface 180 and the dielectric material 164 may be used to represent the substrate temperature.

Figure 4:
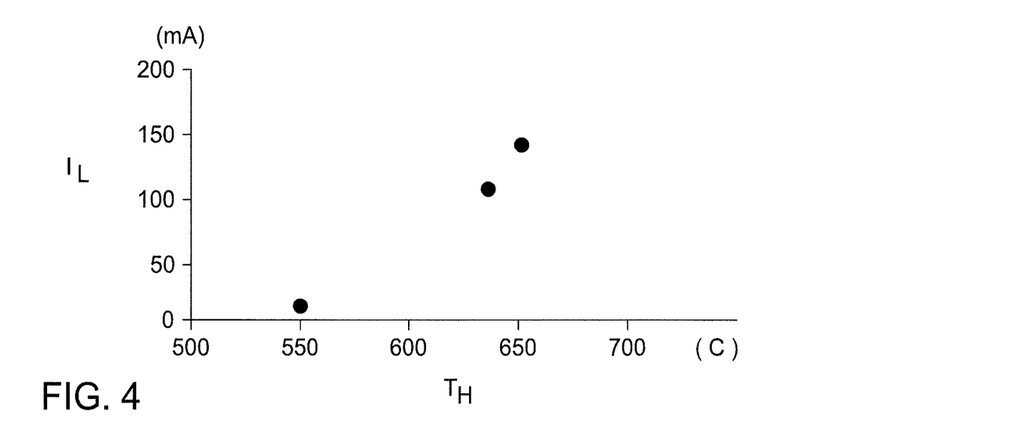
FIG. 4 is a graph showing leakage current $I_L$ measured at different heater temperature setpoints $T_H$ for the substrate support assembly of the processing chamber of FIG. 1, according to one implementation.

FIG. 4 shows a chart for leakage current represented as $I_L$ measured at different heater temperatures represented as $T_H$. As shown in the chart, as the heater temperature increases the leakage current increases. When the heater temperature increases in the temperature range of approximately 575 degrees Celsius and above, the leakage current of the dielectric material 164 of the electrostatic chuck 160 increases. For example, the heater apparatus 170 may operate at the range of between 575 degrees Celsius and 700 degrees Celsius. In other implementations, the heater apparatus 170 may operate at the range of between 560 degrees Celsius and 650 degrees Celsius. In other implementations, the heater apparatus 170 may operate in other temperature ranges.

The dielectric material 164 forms a portion of a leakage circuit that includes the substrate 154, electrode 162, and the electrode power supply 166. As the temperature of the substrate 154 increases, the leakage current increases. The leakage current increases because the resistivity of the dielectric material 164 decreases due to temperature increases of the dielectric material 164. Likewise, as the resistivity of the dielectric material 164 increases due to temperature decreases, the leakage current decreases.

The electrostatic chuck 160 acts as a substrate temperature sensor by providing a temperature-dependent leakage current that is sensed by the leakage current sensor 178 when the processing chamber 100 processes the substrate 154. Empirical information shows that leakage current may be used from the electrostatic chuck 160 more effectively when the heater apparatus 170 is operated at a heater temperature above approximately 575 degrees Celsius during a processing operation of the substrate 154. Below approximately 575 degrees Celsius, the magnitude of the change in leakage current for a small temperature change may be insufficient to be associated with temperature changes. The leakage current may be subject to noise, for example RF signals generated for plasma processing that creates small variations in the leakage current. At heater temperature setpoints of approximately 575 degrees Celsius and above, the leakage current has a sufficient magnitude to be associated with substrate temperature changes that may occur during a processing operation of the substrate 154.

Figure 5:
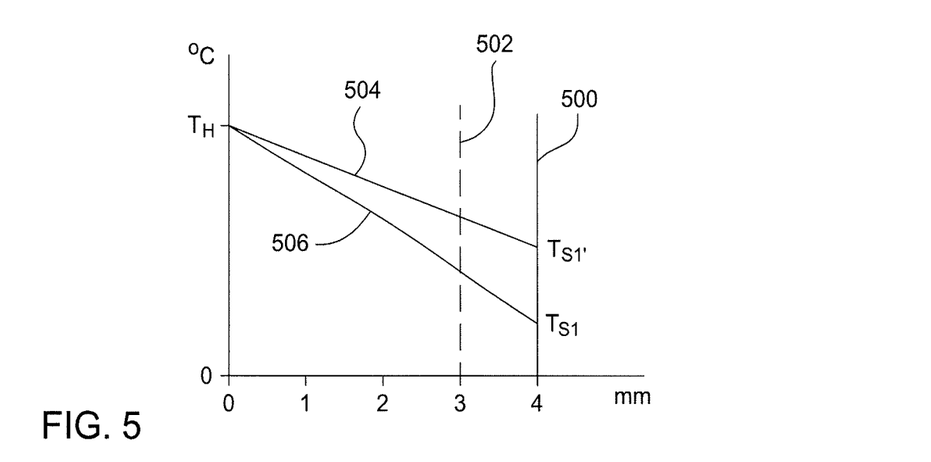
FIG. 5 is a chart showing a relationship of detected temperature to depth for a non-sensor substrate temperature and a sensor substrate temperature, according to another implementation.

Referring to FIG. 5, an example is provided where the heater apparatus 170 has a heater temperature setpoint of $T_H$ degrees Celsius. The heater apparatus 170, including the heater element 176, is separated from the substrate support surface 180 and the substrate 154. The substrate separation line 500 represents the separation distance of the heater apparatus 170 from the substrate support surface 180. The heater apparatus 170 is separated from the electrodes 162, as depicted by an electrode separation line 502 that is dashed. The separation distance between the electrodes 162 and the substrate support surface 180 and substrate 154 may be configured to be 2 mm or less. By placing the electrodes 162 close to the substrate support surface 180 and the substrate 154, the leakage current from the electrostatic chuck 160 may be used to more effectively determine the substrate temperature. In other implementations, the electrode separation distance may be greater than 2 mm. In FIG. 5, for illustration purposes the electrodes 162 are shown to be 3 mm from the heater apparatus 170, and the substrate support surface 180 is 4 mm from the heater apparatus 170.

The heater temperature setpoint for the heater apparatus 170 is shown to be at $T_H$ degrees Celsius. The heater apparatus 170 is maintained at the heater temperature setpoint by heater temperature sensor 182, shown in FIGS. 1 and 2, and the system controller 186. If the heater temperature drifts from the heater temperature setpoint, as measured by the heater temperature sensor 182, the system controller 186 signals the heater power supply 172 to adjust the power supplied to the heater apparatus 170 and the heater output of the heater apparatus 170 so that the heater temperature moves towards the heater temperature setpoint.

Because of the separation distance between the heater apparatus 170 and the substrate 154, the substrate temperature during a processing operation will typically be below the heater temperature. Empirical data may be used to infer a non-sensor substrate temperature $T_{S1'}$. A non-sensor substrate temperature $T_{S1'}$ is shown for the heater temperature of $T_H$ degrees Celsius. The first line 504 depicts how substrate temperature changes with distance from the heater apparatus 170. As depicted by the first line 504, the non-sensor substrate temperature $T_{S1'}$ decreases from the heater temperature $T_H$ as the distance of the substrate 154 from the heater apparatus 170 increases. The non-sensor substrate temperature $T_{S1'}$ does not use the electrostatic chuck 160 as a substrate temperature sensor. The non-sensor substrate temperature $T_{S1'}$ may be inaccurate because the heat inputs and outputs to the substrate 154 may vary.

For example, the heat inputs and outputs to the substrate 154 may vary as the processing chamber 100 is used over a period of time, over a processing operation, or over a plurality of processing runs so that the empirical data for the substrate temperature $T_{S1'}$ becomes less accurate. Over a period of time of using the processing chamber 100, characteristics of the processing chamber 100 may change. For example, coatings may form on the components in the processing chamber 100 over a plurality of processing runs that causes the substrate temperature to drift from the non-sensor substrate temperature $T_{S1'}$ for a selected heater temperature setpoint. Additional empirical data to adjust the non-sensor substrate temperature $T_{S1'}$ may be needed to account for the changed characteristics or processing environment of the processing chamber 100. Obtaining additional empirical data may require the processing chamber 100 to be taken out of service for maintenance and quality control, and accordingly, may be undesirable.

A substrate temperature $T_{S1}$ may be determined using the electrostatic chuck 160 as a substrate temperature sensor. The substrate temperature $T_{S1}$ is determined using the leakage current from the electrostatic chuck 160. Empirical data may be used to relate leakage current to substrate temperature. As depicted in FIG. 5 by a second line 506, the substrate temperature may be determined based on leakage current determined when the heater temperature is at $T_H$ degrees Celsius. As shown in FIG. 5, the substrate temperature determined without resort to leakage current is different from that determined using leakage current, and the difference grows with distance from the heater.

The leakage current is determined during the processing operation of the substrate 154 in the processing chamber 100. Because the leakage current is determined during the processing operation, changes to the characteristics of the processing chamber 100, for example coatings on the components in the processing chamber 100, are factored into the leakage current determined and the corresponding substrate temperature. The use of the substrate temperature determined using the leakage current provides the benefit of not requiring frequent removal of the processing chamber 100 from operation to obtain empirical data to account for changing characteristics of the processing chamber 100.

Figure 6:
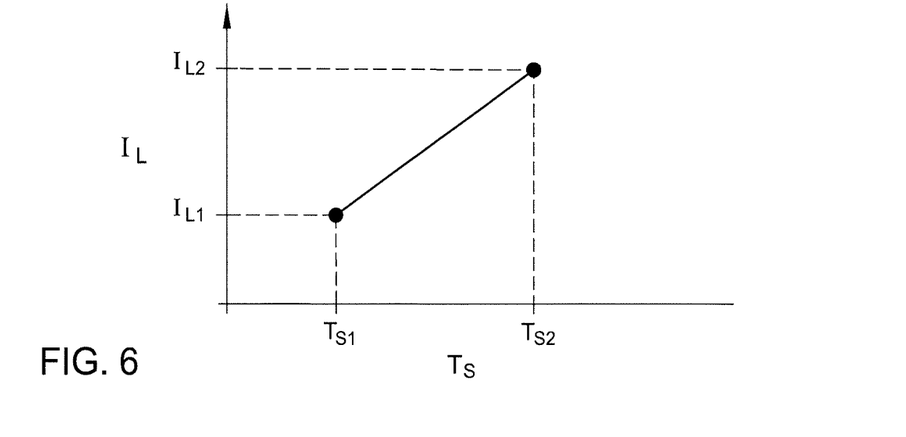
FIG. 6 is a chart showing leakage current IL and substrate temperatures, according to another implementation.

Referring to FIG. 6, a chart is shown depicting the relationship between leakage current and the substrate temperature. A leakage current $I_{L1}$ corresponds to a substrate temperature $T_{S1}$ and a leakage current $I_{L2}$ corresponds to a substrate temperature $T_{S2}$. The change in leakage current corresponds to a substrate temperature change. During a processing operation of the substrate 154, a change in substrate temperature $T_s$ or substrate temperature change $dT_s$ is associated with a change of leakage current $I_{L1}$ and may be represented by:

$$\frac{dI_L}{0.5(I_{L1} + I_{L2})} \propto dT_s$$

wherein $I_L$ is a leakage current, and the correspondence of leakage currents to substrate temperatures may be determined through experimentation.

A change in substrate temperature as a function of leakage current during a processing operation of the substrate 154 is provided in the equation below:

$$dT_s = \frac{1}{A} \frac{(dI_L)}{(I_L)}$$

wherein $I_L$ is leakage current, and A is leakage constant. The constant A may be determined through experimentation. The processing chamber 100 may be used in the experimentation and multiple processing operations and processing runs on substrates 154 may be performed using the same electrostatic chuck 160, the same power supplied to the electrostatic chuck 160, and the same processing operation on the substrates 154. The substrate temperature may then be varied, for example by using an additional heat source proximate the processing chamber 100, during the multiple processing operations and processing runs of multiple substrates 154. The leakage current may then be determined for the multiple processing operations, processing runs, and the varied substrate temperatures. Based on experimental data from the multiple processing operations, the constant A may be determined.

Figure 7:
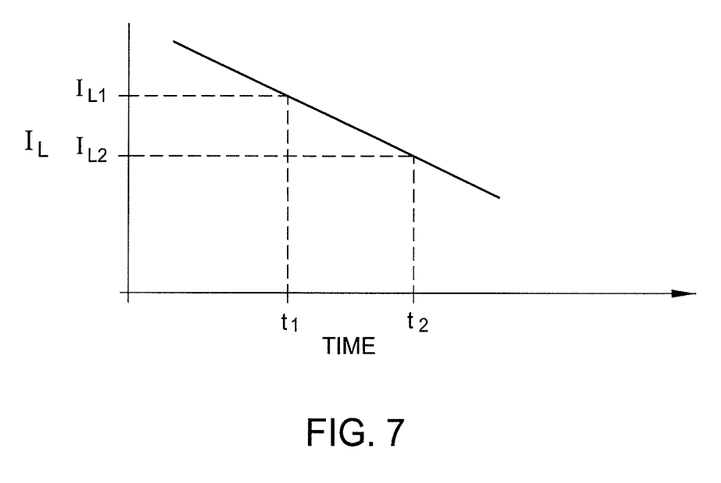
FIG. 7 is a chart showing a leakage current change over time, according to another implementation.
Figure 8:
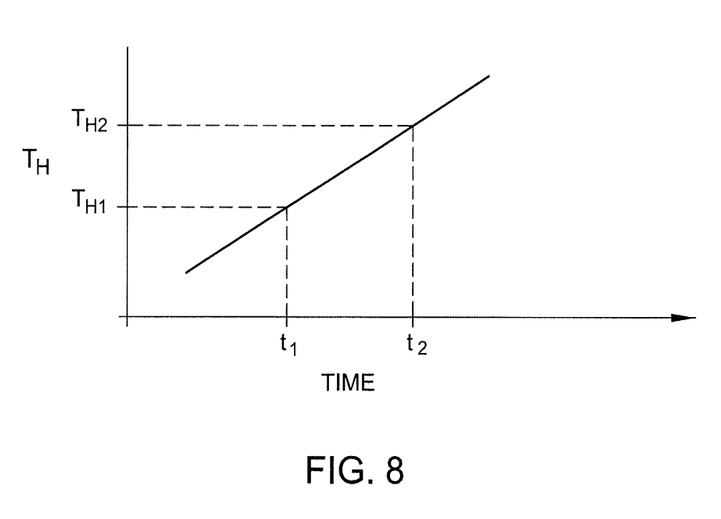
FIG. 8 is a chart showing a heater temperature setpoint change over time, according to another implementation.

Referring to FIG. 7 and FIG. 8, the heater temperature setpoint of the heater apparatus 170 may be changed during a processing operation of the substrate 154 or for a subsequent processing run of another substrate 154 based on changes in the leakage current. The heater temperature setpoint $T_{H1}$ is selected to maintain a target substrate temperature during a processing operation. The electrostatic chuck 160 is used as a substrate temperature sensor to determine the substrate temperature during a processing operation of the substrate 154. As shown in FIG. 7, a leakage current $I_{L1}$ is measured at time $t_1$ with the heater apparatus 170 having a first heater temperature setpoint $T_{H1}$. During the processing operation, the leakage current sensor 178 measures the leakage current $I_{L2}$ and sends the leakage current information corresponding to leakage current $I_{L2}$ to the system controller 186. The leakage current has decreased from leakage current $I_{L1}$ to leakage current $I_{L2}$ from $t_1$ to $t_2$. The decrease from leakage current $I_{L1}$ to leakage current $I_{L2}$ indicates that the resistivity of the dielectric material 164 in the electrostatic chuck 160 has increased and the substrate temperature has decreased.

The substrate temperature during the processing operation of substrate 154 is typically maintained at the target substrate temperature. The heater apparatus 170 may be varied to adjust the substrate temperature towards the target substrate temperature to account for the drift in substrate temperature away from the target substrate temperature. As shown in FIG. 8, the heater temperature setpoint for the heater apparatus 170 is adjusted to increase the heater temperature setpoint from $T_{H1}$ to $T_{H2}$ to increase the substrate temperature towards the target substrate temperature. The heater apparatus 170 outputs additional heat at the heater temperature setpoint $T_{H2}$ so that the substrate temperature is increased and moves towards the target substrate temperature.

Figure 9:
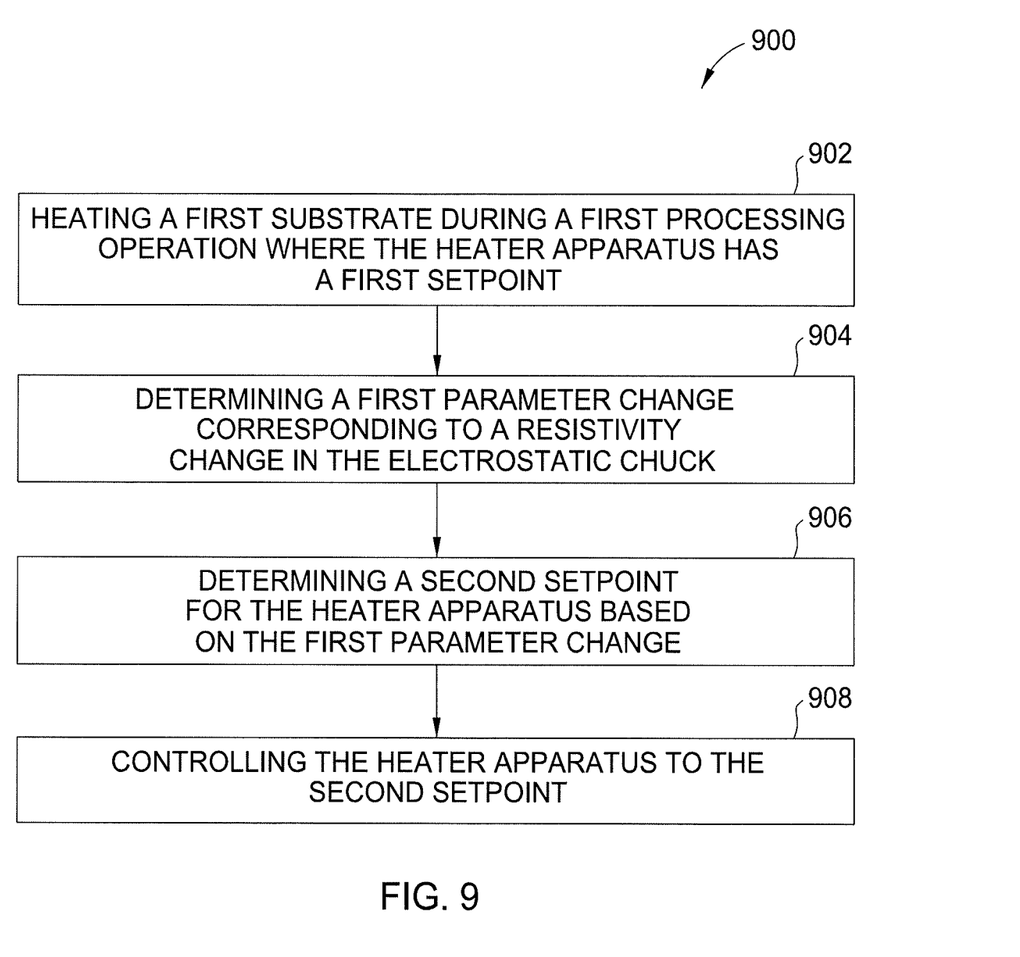
FIG. 9 is a flowchart of a processing method for a substrate, according to another implementation.

In operation, a control method 900 of controlling a substrate temperature in a processing chamber 100 is depicted in FIG. 9. The control method 900 includes heating a first substrate during a first processing operation on the first substrate with a heater apparatus 170, at block 902. The heater apparatus 170 has a first heater temperature setpoint during at least a first portion of the first processing operation. The first substrate is disposed in the processing chamber 100 above the electrostatic chuck 160.

The system controller 186 may operate a process program to control the substrate temperature, as described in the implementations herein. For example, the process program may be stored on memory 210 or other non-transitory memory and may be used by the system controller 186. The system controller 186 may control the heater apparatus 170 by causing the heater power supply 172 to provide power to the heater apparatus 170 so that the heater apparatus 170 operates at the first heater temperature setpoint.

The system controller 186 may store the first heater temperature setpoint. The system controller 186 may determine a first parameter change for the processing chamber 100 where the first parameter change corresponds to a resistivity change in the electrostatic chuck 160, at block 904. Determining the first parameter change may include determining a first parameter during the first processing operation where the first parameter corresponds to a first resistivity in the electrostatic chuck 160. The first parameter may be compared to a second parameter where the second parameter corresponds to a second resistivity. The first parameter may be a first leakage current and the second parameter may be a second leakage current. The first parameter change may be a first leakage current change, and the second heater temperature setpoint may be determined as a function of the leakage current change during at least a portion of the first processing operation.

The control method 900 includes determining a second heater temperature setpoint for the heater apparatus 170 by using the first parameter change, at block 906. The control method 900 includes controlling the heater apparatus 170 to adjust the heater apparatus 170 to the second heater temperature setpoint, at block 908. The heater apparatus 170 is adjusted to the second heater temperature setpoint by adjusting a power provided to the heater apparatus 170 to adjust the substrate temperature towards a target substrate temperature. The target substrate temperature is the substrate temperature that is selected for the processing chamber 100 to perform the processing operation. The target substrate temperature is maintained by adjusting the heater apparatus 170 to the second heater temperature setpoint. The target substrate temperature may have a tolerance range. The substrate is maintained at the target substrate temperature by maintaining the target substrate temperature within the tolerance range.

In some implementations, the first processing operation is performed in a first processing run. The method of controlling the substrate temperature further includes heating a second substrate with the heater apparatus 170 during a second processing operation performed in a second processing run. The heater apparatus 170 is adjusted to the second heater temperature setpoint during at least a portion of the second processing operation.

In some implementations, the method of controlling the substrate temperature in the processing chamber 100 further includes adjusting the heater apparatus 170 to the second heater temperature setpoint during a second portion of the first processing operation on the first substrate.

In some implementations, the method of controlling the substrate temperature in the processing chamber 100 includes performing a plurality of first processing runs to process a plurality of first substrates. At least one of the plurality of first substrates is processed during each of the first processing runs. The heater apparatus 170 is controlled to have a first heater temperature setpoint during the plurality of first processing runs. A first parameter change is determined where the first parameter change corresponds to a plurality of first resistivity changes in the electrostatic chuck 160 disposed in the processing chamber 100 during the plurality of first processing runs. A second heater temperature setpoint is determined for the heater apparatus 170 by using the first parameter change.

A plurality of second processing runs is performed to process a plurality of second substrates. The heater apparatus 170 is controlled to have the second heater temperature setpoint during the plurality of second processing runs. The determining the first parameter change includes determining a plurality of first parameters during the plurality of first processing runs, and comparing the plurality of first parameters to at least one second parameter. The plurality of first parameters corresponds to a plurality of resistivities in the electrostatic chuck 160 where each of the first processing runs is associated with at least one of the plurality of resistivities. The plurality of first parameters may be a plurality of first leakage currents. The at least one second parameter corresponds to a second resistivity. The second parameter may be a second leakage current.

In some implementations, the system controller 186 may use a look-up table that includes heater temperature setpoints that are associated with leakage current parameters and other information for processing operations. The look-up table may be stored in memory 210 or other non-transitory memory, and accessible by the system controller 186. For example, the second heater temperature setpoint may be identified with one or more leakage current parameters in the look-up table.

The implementations disclosed herein provide an apparatus and method for controlling the substrate temperature in the processing chamber 100 without the need for complicated hardware designs or complex calibration of temperature sensors. The electrostatic chuck 160 and leakage current sensor 178 is used to function as a virtual temperature sensor. The virtual temperature sensor is used to determine changes in substrate temperature and the substrate temperature changes may then be used to adjust the heater temperature setpoint of the heater apparatus 170 to maintain the target substrate temperature. Adjusting the heater temperature setpoint as described may have the benefit of reducing the amount of time that the processing chamber 100 is undergoing maintenance and quality control operations.

While the foregoing is directed to examples of the present disclosure, other and further examples of the disclosure may be devised without departing from the basic scope thereof, and the scope thereof is determined by the claims that follow.

What is claimed is:
1. A method comprising:
heating a first substrate using a heater apparatus during a first processing operation, wherein the heater apparatus is controlled to a first temperature setpoint during at least a first portion of the first processing operation, and wherein the first substrate is disposed on a substrate support surface of an electrostatic chuck in a processing chamber;
determining a first parameter change corresponding to a resistivity change in the electrostatic chuck, wherein determining the first parameter change further comprises:
determining a first parameter during the first processing operation, wherein the first parameter is a first leakage current corresponding with a first resistivity in the electrostatic chuck; and
comparing the first parameter to a second parameter to determine a change therebetween, wherein the second parameter is a second leakage current corresponding with a second resistivity in the electrostatic chuck, and wherein the electrostatic chuck comprises an electrode and a dielectric material disposed adjacent to the electrode;
determining a second temperature setpoint for the heater apparatus based on the first parameter change; and
controlling the heater apparatus to the second temperature setpoint.

2. The method of claim 1, wherein heating the first substrate is performed during a first processing run, and wherein the method further comprises:
heating a second substrate using the heater apparatus during a second processing operation performed during a second processing run; and
controlling the heater apparatus to the second temperature setpoint during at least a portion of the second processing operation.

3. The method of claim 1, wherein controlling the heater apparatus to the second temperature setpoint further comprises:
heating the first substrate during a second portion of the first processing operation.

4. The method of claim 1, wherein controlling the heater apparatus to the second temperature setpoint comprises:
adjusting a power provided to the heater apparatus to adjust a substrate temperature towards a target substrate temperature.

5. The method of claim 4, wherein controlling the heater apparatus to the second temperature setpoint comprises maintaining the substrate temperature within a tolerance temperature range around the second temperature setpoint.

6. The method of claim 1 further comprising:
powering the electrode with an electrode power supply.

7. The method of claim 1, wherein determining the first parameter change further comprises:
measuring the first leakage current flowing through the electrostatic chuck disposed in the processing chamber during the first processing operation;
determining a first leakage current change using the first leakage current; and
determining a substrate temperature change using the first leakage current change, wherein the determining the second temperature setpoint for the heater apparatus further comprises using the substrate temperature change to determine the second temperature setpoint.

8. A non-transitory machine readable storage medium having stored thereon a computer program for processing a substrate in a processing chamber, the computer program comprising a set of instructions for causing the processing chamber to perform a process comprising:
heating a first substrate using a heater apparatus during a, first processing operation, wherein the heater apparatus is controlled to a first temperature setpoint during at least a first portion of the first processing operation, and wherein the first substrate is disposed on a substrate support surface of an electrostatic chuck in a processing chamber;
determining a first parameter change corresponding to a resistivity change in the electrostatic chuck, wherein determining the first parameter change further comprises:
determining a first parameter during the first processing operation, wherein the first parameter is a first leakage current corresponding with a first resistivity in the electrostatic chuck; and
comparing the first parameter to a second parameter to determine a change therebetween, wherein the second parameter is a second leakage current corresponding with a second resistivity in the electrostatic chuck, and wherein the electrostatic chuck comprises an electrode and a dielectric material disposed adjacent to the electrode;
determining a second temperature setpoint for the heater apparatus based on the first parameter change; and
controlling the heater apparatus to the second temperature setpoint.

9. The non-transitory machine readable storage medium of claim 8, wherein determining a first parameter change comprises:
measuring a the first leakage current flowing through the electrostatic chuck disposed in the processing chamber during the first processing operation;
determining a first leakage current change using the first leakage current; and
determining a substrate temperature change using the first leakage current change, wherein the determining the second temperature setpoint for the heater apparatus further comprises using the substrate temperature change to determine the second temperature setpoint.

10. The non-transitory machine readable storage medium of claim 8, wherein controlling the heater apparatus to the second temperature setpoint comprises:
adjusting a power provided to the heater apparatus to heat the substrate to a target substrate temperature.

11. A system for processing a substrate, comprising:
a chamber body defining a processing volume therein,
a substrate support assembly disposed in the processing volume, the substrate support assembly having an electrostatic chuck and a heater;
a first sensor, wherein the first sensor is a leakage current sensor; and
a controller configured to receive a signal from the first sensor corresponding to a change in a resistivity of the electrostatic chuck and, in response to receiving the signal, to control the heater to a first temperature setpoint.

12. The system of claim 11 further comprising:
a temperature sensor configured to measure a temperature of the heater.

13. The system of claim 12, wherein the temperature sensor is coupled to the controller and configured to provide a measured heater temperature thereto.

14. The system of claim 13, wherein the first temperature setpoint corresponds to the measured heater temperature, and wherein the controller is configured to adjust the first temperature setpoint to a second temperature setpoint in response to receiving the signal from the first sensor.

15. The system of claim 11 further comprising:
a top electrode configured to generate a plasma within the processing volume.

* * * * *